United States Patent [19]

Misaizu

[11] Patent Number: 5,557,445
[45] Date of Patent: Sep. 17, 1996

[54] OPTICAL SIGNAL TRANSMITTER HAVING AN APC CIRCUIT WITH AUTOMATIC BIAS CURRENT CONTROL

[75] Inventor: Setsuo Misaizu, Yokohama, Japan

[73] Assignee: Fujitsu Limited, Kanagawa, Japan

[21] Appl. No.: 303,372

[22] Filed: Sep. 9, 1994

[30] Foreign Application Priority Data

Feb. 25, 1994 [JP] Japan .................. 6-052958

[51] Int. Cl.⁶ .................................. H04B 10/04
[52] U.S. Cl. .................. 359/187; 359/180; 359/162; 372/38
[58] Field of Search .................... 359/180, 162, 359/181–182, 187; 372/38

[56] References Cited

U.S. PATENT DOCUMENTS

| | | | |
|---|---|---|---|
| 4,471,494 | 9/1984 | Keil et al. | 359/187 |
| 4,504,976 | 3/1985 | Beaudet | 359/187 |
| 4,995,045 | 2/1991 | Burley et al. | 372/38 |
| 5,153,765 | 10/1992 | Grunziger | 359/180 |
| 5,373,387 | 12/1994 | Bosch et al. | 359/187 |

FOREIGN PATENT DOCUMENTS

| | | |
|---|---|---|
| 2025121 | 1/1980 | United Kingdom . |
| 1565764 | 4/1980 | United Kingdom . |
| 2061607 | 5/1981 | United Kingdom . |

*Primary Examiner*—Leo Boudreau
*Assistant Examiner*—Kinfe-Michael Negash

[57] ABSTRACT

An optical signal transmitter has a laser diode, and an automatic bias current control circuit by which the relation between a light output of the laser diode, a threshold current and bias current are kept constant. The automatic bias current control circuit includes a circuit for modulating a bias current of the laser diode in amplitude with a signal of frequency f1, which is lower than that of the input signal, and a circuit for detecting the signal component of the frequency f1 included in the light output of the laser diode and controlling so as that a detected output becomes a fixed value.

10 Claims, 11 Drawing Sheets

$I_{th} < I_b$ $I_{th} > I_b$

OPTICAL SIGNAL TRANSMITTER HAVING AN APC CIRCUIT WITH AUTOMATIC BIAS CURRENT CONTROL

BACKGROUND OF THE INVENTION

1. Field of the Invention

The present invention relates to an optical signal transmitter using a laser diode. More particularly, the invention relates to an optical signal transmitter having an APC circuit with automatic bias current control.

2. Description of the Related Art

In an optical signal transmitter using a laser diode (LD) for directly modulating the diode with an input signal, a bias current and a threshold current are changed due to secular deterioration of LD characteristic, temperature variation and electric source change, which causes the problems of change in the LD light-emitting power characteristic and deterioration of transmitting characteristic.

Thus, various kinds of circuit have been proposed to keep the characteristic of light-emitting power of LD constant with an APC (Auto Power Control) circuit. FIG. 13 is a block diagram showing one example of the circuit for transmitting an optical signal, having an APC circuit.

In FIG. 13, a driving circuit 1 makes a LD driving current Ip from a first current source 2 flow to a LD (laser diode), corresponding to '1' or '0' of the input signal inputted from an input terminal IN, and switches the laser light-emission ON or OFF.

Further, a second current source 3 supplies a direct bias current Ib required to be input to the LD. An LD driving control voltage Vp and a bias control voltage Vb of the LD are supplied to the first current source 2 and the second current source 3, respectively.

On the other hand, a part of the laser light emitted from the LD is received by the photo diode (PD), and the average value is converted by a resistor R1 to a voltage Vpd in proportion to the laser light emitted from the LD.

An amplifier 4 controls the output voltage Va so as that the voltage Vpd becomes equal to the reference voltage Vref. Further, the above-described control voltages Vp and Vb are obtained by amplifying the output voltage Va on the amplifiers 5 and 6 having each gains of Gp and Gb.

It is controlled automatically, so as to keep the light output of the LD constant by the feedback loop. Further, the ratio of Ip to Ib is set by the gains Gp and Gb of the amplifiers 5 and 6, optionally.

Hereupon, it is a static characteristic of the LD with changed inclination η and threshold current Ith, equally, according to the temperature as shown in FIG. 14. The light output (Pout) can be obtained from the LD, as shown in the diagram of FIG. 14, by setting the bias current Ib near around the threshold current Ith, and flowing the driving current Ip in addition to the bias current Ib.

Accordingly, it is required to keep the relation of Ib and Ith at the optimal value, in the cases where an optical signal is transmitted by switching LD ON or OFF, at high speed. In the prior art shown in FIG. 13, the gains Gb and Gp of the amplifiers 5 and 6 are controlled, to keep Ib/Ith on the optimal value.

Further, it is also required for keeping the light output and Ib/Ith constant to change the rate of Ip to Ib according to the temperature. However, the conventional structure does not have any means for changing the ratio of Ip to Ib, independently, according to the temperature.

Thus, there is a problem of deterioration of the transmitting characteristic, as a result of changing the relation of Ib/Ith depending on the temperature and not obtaining the optimal value.

SUMMARY OF THE INVENTION

It is therefore an object of the present invention to provide an optical signal transmitter having an APC circuit to solve the problem of the conventional circuit.

An optical signal transmitter according to the present invention comprises a laser diode directly modulated by an input signal, a circuit for performing the amplitude modulation of a bias current of the laser diode with a signal of the frequency f1 which is lower than that of the input signal, and a circuit for detecting a signal component of the frequency f1 included in the light output of the laser diode and controlling said detecting output so as to be a fixed value.

The structure comprises a laser diode directly modulated by the input signal, a photo diode for detecting the light emitting output of the laser diode, an oscillator for outputting a signal of frequency f1, which is lower than that of the input signal, and a circuit for performing the amplitude modulation of the detected output of the photo diode according to the oscillator with the signal of the frequency f1 which is lower than that of the input signal and controlling the bias current of the laser diode.

In the present invention, the bias current of the LD is amplitude-modulated by the frequency f1 which is lower than the frequency of the input signal, and the f1 frequency component included in the light output of the LD is detected. And the bias current is controlled so as that the f1 frequency component becomes a fixed value.

Hereby, the relation between the bias current Ib of the LD and the threshold current Ith can be kept constant (Ib≈Ith), at all times.

Further, other objects of the present invention become clear from the description for explaining embodiments according to the attached drawings.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
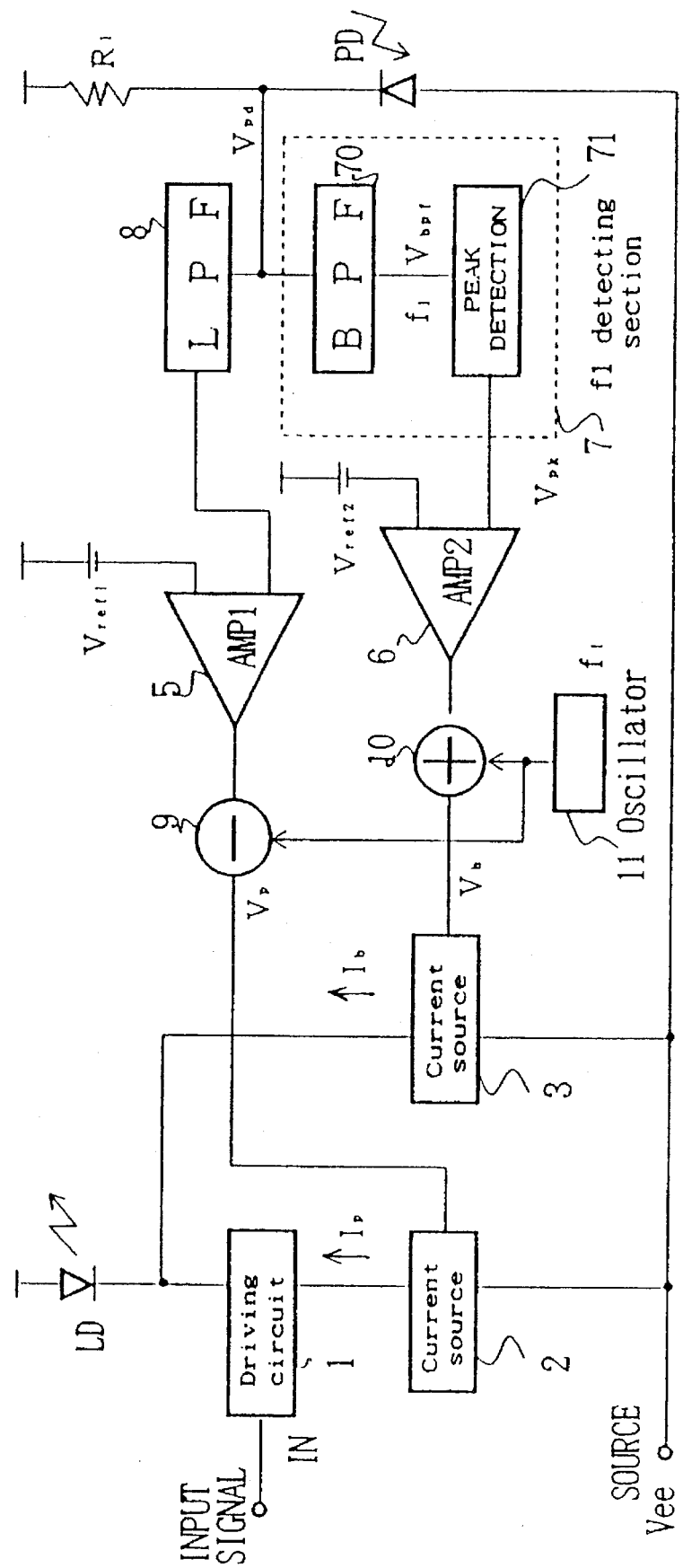
FIG. 1 is a block diagram of the first embodiment according to the present invention.
Figure 2:
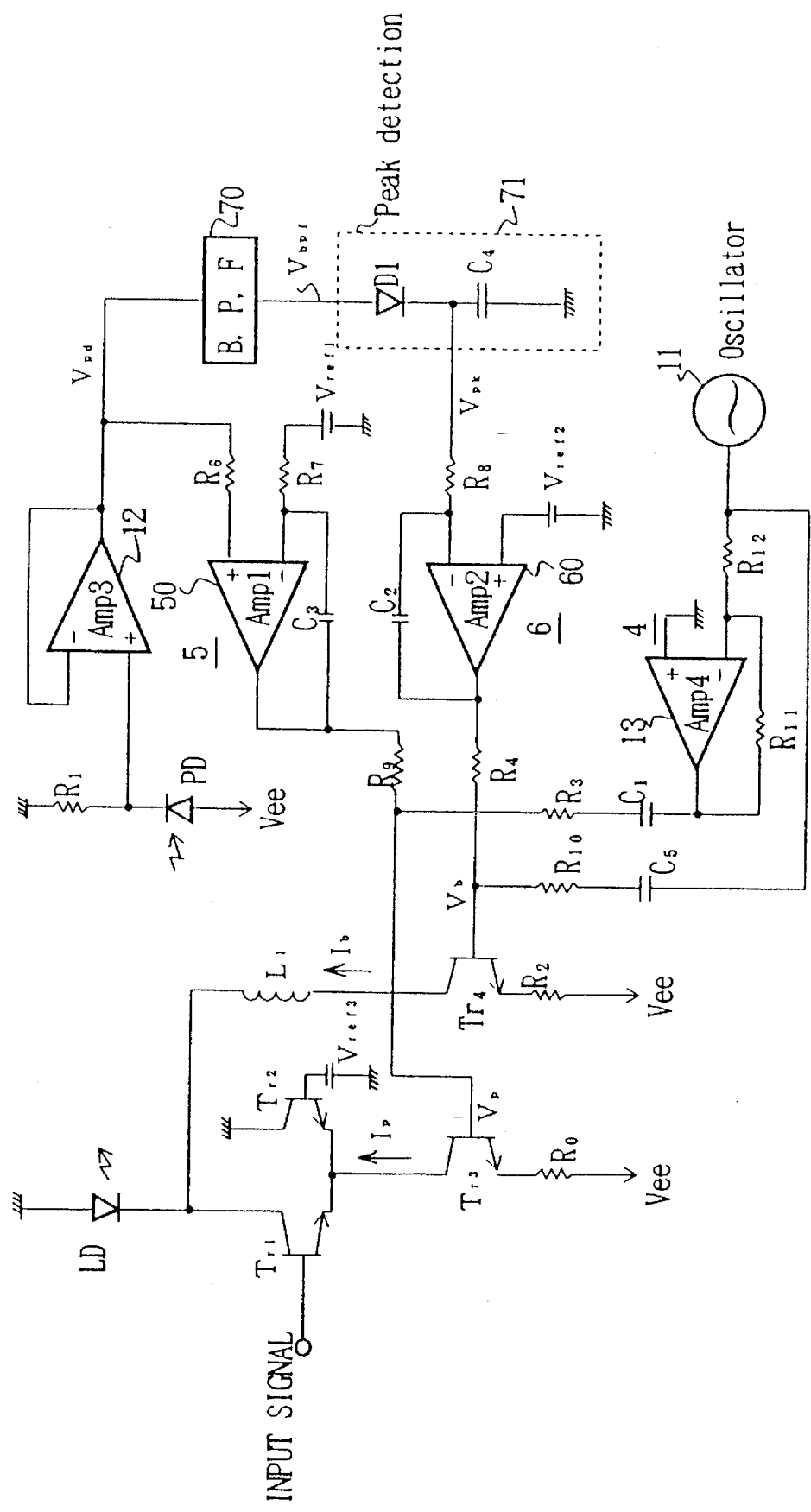
FIG. 2 is a detailed diagram showing the circuit of the first embodiment according to the present invention.

FIG. 1 is a diagram of the first embodiment according to the present invention. Further, FIG. 2 is a detailed diagram showing the circuit corresponding to FIG. 1, and FIGS. 3A through 3C, 4A through 4C and 5A through 5C are explanatory diagrams of the operation of the first embodiment. Identical reference numerals or symbols will be used to designate identical or corresponding components or portions throughout the following description of the present invention.

A driving circuit 1 makes the current Ip from the first current source 2 flow to the LD, corresponding to '1' or '0' of the input signal from the input terminal IN, and switches the light ON or OFF. As shown in the detailed circuit of FIG. 2, the driving circuit 1 is composed of the differential pair of transistors Tr1 and Tr2 which have a common emitter.

The input signal is supplied to the base of the transistor Tr1, and the collector of the transistor Tr1 is connected to the LD in series. The first current source 2 is composed of a transistor Tr3 and an emitter resistor R0. Accordingly, when the input signal supplied to the base of the transistor Tr1 is '1', the transmitter becomes ON, and operates so as to make the current Ip from the current source 2 flow to the LD. And the size of the current Ip is controlled by a control voltage Vp given to the base of the transistor Tr3.

Returning to FIG. 1, the second current source 3 supplies to the LD the direct bias current Ib required for emitting the LD. This second current source 3 is composed of a coil L1, a transistor Tr4, and a resistor R2 as shown in the detailed circuit of FIG. 2.

And the direct bias current Ib is controlled by the control voltage Vb supplied to the base of the transistor Tr4.

The first embodiment of the present invention has a characteristic of generating the above-described control voltages Vp and Vb according to the structure described later.

That is, the control voltage Vp is generated by an amplifier 5, a low pass filter 8 and a subtracter 9. On the other hand, the control voltage Vb is generated by an amplifier 6, an f1 detecting section 7 and an adder 10.

The signal of the frequency f1 from the oscillator 11 is inputted to the subtracter 9 and the adder 10, the signal of the frequency f1 is subtracted from the output of the amplifier 5, and further, the signal of the frequency f1 is added to the output of the amplifier 6, respectively, so that they become the control voltage Vp and Vb.

That is, the output of the amplifier 5 is modulated by the reversed-phase signal of frequency f1 from the oscillator 11. Further, the output of the amplifier 6 is modulated by the signal of frequency f1 from the oscillator 11 and they are made as the control voltage signals Vp and Vb, respectively.

Hereby, the signal of frequency f1 is that of the frequency which is sufficiently low for the input signal supplied to the input terminal IN. In the embodiment, when, for example, the input signal is of frequency 2.5 GHz, the frequency f1 is the extent of 10 KHz.

The average value of the voltage Vpd obtained from the photo diode PD and the resistor R1 by receiving a part of the laser light emitted by the LD is detected by the low pass filter 8, and the output is inputted to the amplifier 5.

And the output from the amplifier 5 can be obtained so as that the average value of the voltage Vpd is equal to the first reference voltage Vref 1.

Hereupon, the cutoff frequency of the low pass filter 8 has a value which is lower than frequency f1 of the output from the oscillator 11. Thus, the signal component of frequency f1 of the output from the oscillator 11 is not included in the output from the amplifier 5.

On the other hand, the amplifier 6 is controlled so that the peak voltage Vpk from the f1 detecting section 7 is inputted and this peak voltage Vpk becomes equal to the second reference voltage Vref 2. The output of the amplifier 6 is modulated with the output of the frequency f1 from the oscillator 11.

Here, the f1 detecting section 7 has a band pass filter 70 for extracting the frequency f1 component included in the voltage Vpd and a peak detecting circuit 71 for detecting the peak value of the output of the band pass filter 70.

The detailed circuit of the embodiment in which the control voltage Vp and Vb are generated will be explained with reference to FIG. 2.

In the detailed circuit shown in FIG. 2, a part of the light emission of the LD detected by the PD and the resistor R1 is amplified by the operational amplifier 12, and becomes the voltage Vpd of the average value shown in FIG. 1. The amplifier 5 has an operational amplifier 50, input resistors R6 and R7, a feedback capacitor C3 and an output resistor R9 in the circuit shown in FIG. 2.

Further, the first reference voltage Vref1 is inputted to the negative input terminal of the operational amplifier 50 via the input resistor R7.

In the circuit shown in FIG. 2, the function of the low pass filter 8 is performed in the amplifier 5, substantially, by the input resistor R6 and internal-constant elements of the operational amplifier 50. Accordingly, no structural element of the individual low pass filter 8 is included in the circuit shown in FIG. 2.

Therefore, the voltage output in proportion to the average voltage Vpd appears in the output resistor R9 of the operational amplifier 50.

On the other hand, the amplifier 6 has an operational amplifier 60, an input resistor R8, a feedback capacitor C2 and the output resistor R4. The second reference voltage Vref2 is inputted to the positive input terminal of the operational amplifier 60, directly.

The peak detecting circuit 71 of the f1 detecting section 7 is composed of a series circuit of a diode D1 and a capacitor C4. The potential of the capacitor C4 in the peak detecting circuit 71, that is, the peak value Vpk is inputted to the negative input terminal of the operational amplifier 60, via the input resistor R8.

Further, the output of the oscillator 11 is connected to the output resistor R4 of the operational amplifier 60, via the filter composed of a resistor R10 and a capacitor C5, directly. Accordingly, the output of the operational amplifier 60 is added to the output of the oscillator 11 and becomes the control voltage Vb.

And the output of the oscillator 11 is also inputted to the negative input terminal of the amplifier 4 composed of an operational amplifier 13, an input resistor R12, and a feedback resistor R11. Accordingly, the output of the oscillator 11 is reversed. This reversed output is further connected to the output resistor R9 of the amplifier 5, via the filter composed of a resistor R3 and a capacitor C1.

Accordingly, the output of the amplifier 5 appeared on the output resistor R9 is substracted to the output of the oscillator 11, and becomes the control voltage Vp.

Next, the operation of the first embodiment and the effectiveness brought by the present invention will be further explained with reference to FIGS. 3A through 3C and 4A through 4C.

Figure 3A:
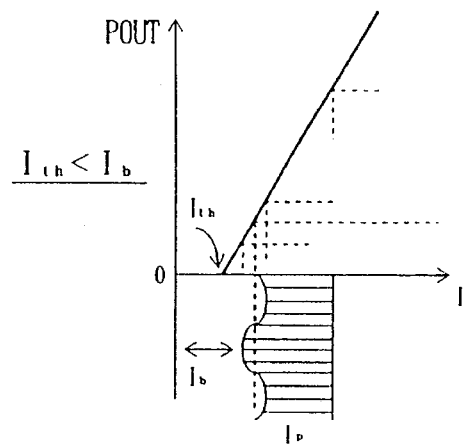
FIG. 3A through 3C are first explanatory diagrams of the operation of the first embodiment according to the present invention.
Figures 3B, 3C:
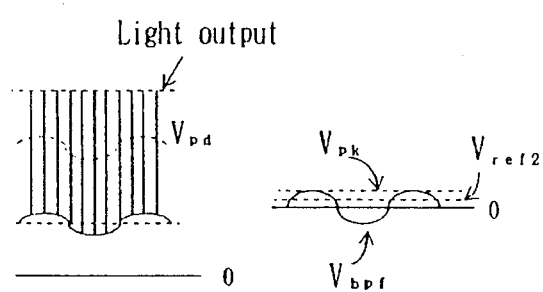

FIGS. 3A through 3C are explanatory diagrams of the operation in the case where the relation between the threshold current Ith and the bias current Ib is Ith<Ib. As explained in connection with FIGS. 1 and 2, the control voltage Vb is obtained by the signal of the frequency f1 from the oscillator 11 added to the output of the amplifier 6, and supplied to the base of the transistor Tr4.

Consequently, the collector current of the transistor Tr4, that is, the bias current Ib varies, corresponding to the signal of frequency f1. Further, as shown in FIG. 3A, the current Ip flowing by switching the transistor Tr3 ON or OFF corresponding to the input signal '1' or '0' is piled up with the bias current Ib.

FIG. 3B shows a light output emitted corresponding to the current flowing to the LD shown in FIG. 3A. In FIG. 3B, Vpd is an average value of the light output Pout detected by the PD, as described above.

FIG. 3C is a diagram showing the relation between the voltage Vbpf obtained by passing the Vpd via the band pass filter 70 and the peak voltage Vpk detected by the peak detecting circuit 71 of voltage Vbpf. In the example shown in FIGS. 3A through 3C, the f1 frequency component of the oscillator 11 appears on the voltage Vpd, as it is. Therefore, the relation between the peak voltage Vpk and the second reference voltage Vref2 becomes Vpk>Vref2.

In this case, the control voltage Vb is reduced, so that the collector current of the transistor Tr4, that is, the bias current Ib is controlled so as to be reduced.

Figure 4A:
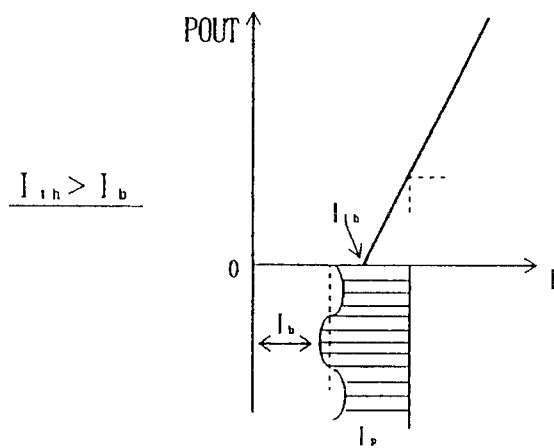
FIG. 4A through 4C are second explanatory diagrams of the operation of the first embodiment according to the present invention.
Figure 4B:
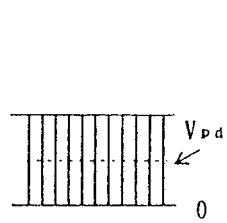
Figure 4C:
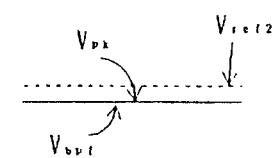

FIGS. 4A through 4C are explanatory diagrams of the operation in the case where the relation between the threshold current Ith and the bias current Ib is Ith>Ib, opposite to the case shown in FIGS. 3A through 3C, and show the state where the bias current Ib is smaller than Ith.

FIG. 4B shows a light output emitted corresponding to the current flowing to the LD shown in FIG. 4A. In FIG. 3B, the Vpd is an average value of the light output Pout detected by the PD, as explained above.

In the example shown in FIGS. 4A through 4C, the f1 frequency component of the oscillator 11 does not appear on the voltage Vpd. Consequently, the voltage Vbpf obtained by passing the Vpd via the band pass filter 70 also becomes 0, substantially. Similarly, the peak voltage Vpk detected in the peak detecting circuit 71 also becomes equal to the voltage Vbpf. The state is shown in FIG. 4C.

In the example shown in FIGS. 4A through 4C, the relation between the peak voltage Vpk and the second reference voltage Vref2 becomes Vpk<Vref2. In this case, the control voltage Vb increases, so that the collector current of the transistor Tr4, that is, the bias current Ib is controlled to increase.

Figure 5A:
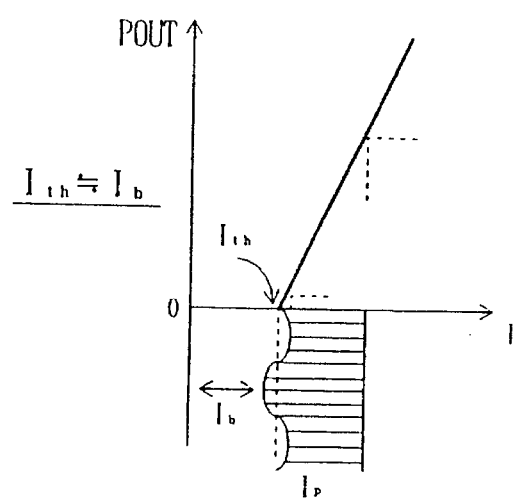
FIG. 5A through 5C are third explanatory diagrams of the operation of the first embodiment according to the present invention.
Figure 5B:
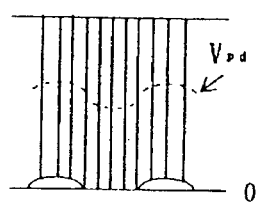
Figure 5C:
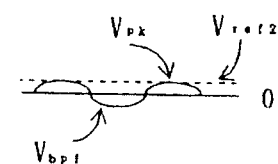

FIGS. 5A through 5C are explanatory diagrams of the operation in the case where the bias current Ib is controlled so as to be reduced, when the relation is Ith<Ib, as shown in FIGS. 3A through 3C, and the bias current Ib is controlled so as to increase, when the relation is Ith>Ib, as shown in FIGS. 4A through 4C, on the contrary, so that the relation becomes Ith≈Ib, as the result.

In FIG. 5A, the threshold current Ith corresponds to the bias current Ib of direct current. However, the f1 frequency component of the oscillator 11 is added to the bias current ib, so that the bias current Ib is over the threshold current Ith, within the period of one half-cycle of the f1 frequency component, and the bias current Ib becomes the threshold current Ith or below, within the period of another half-cycle.

Therefore, the f1 frequency component does not appear within the period of a half-cycle, when the bias current Ib becomes the threshold current Ith or below, as shown in FIG. 5B. Thus, the voltage Vbpf obtained by passing the Vpd through the band pass filter 70 becomes half size, compared with the case shown in FIGS. 3A through 3C.

Consequently, the peak voltage Vpk becomes equal to the voltage Vbpf, as shown in FIG. 5C. That is, Ith=Ib can be kept, if the second reference voltage is controlled so as to be Vpk=Vbpf2, when Ith is equal to Ib.

Figure 6:
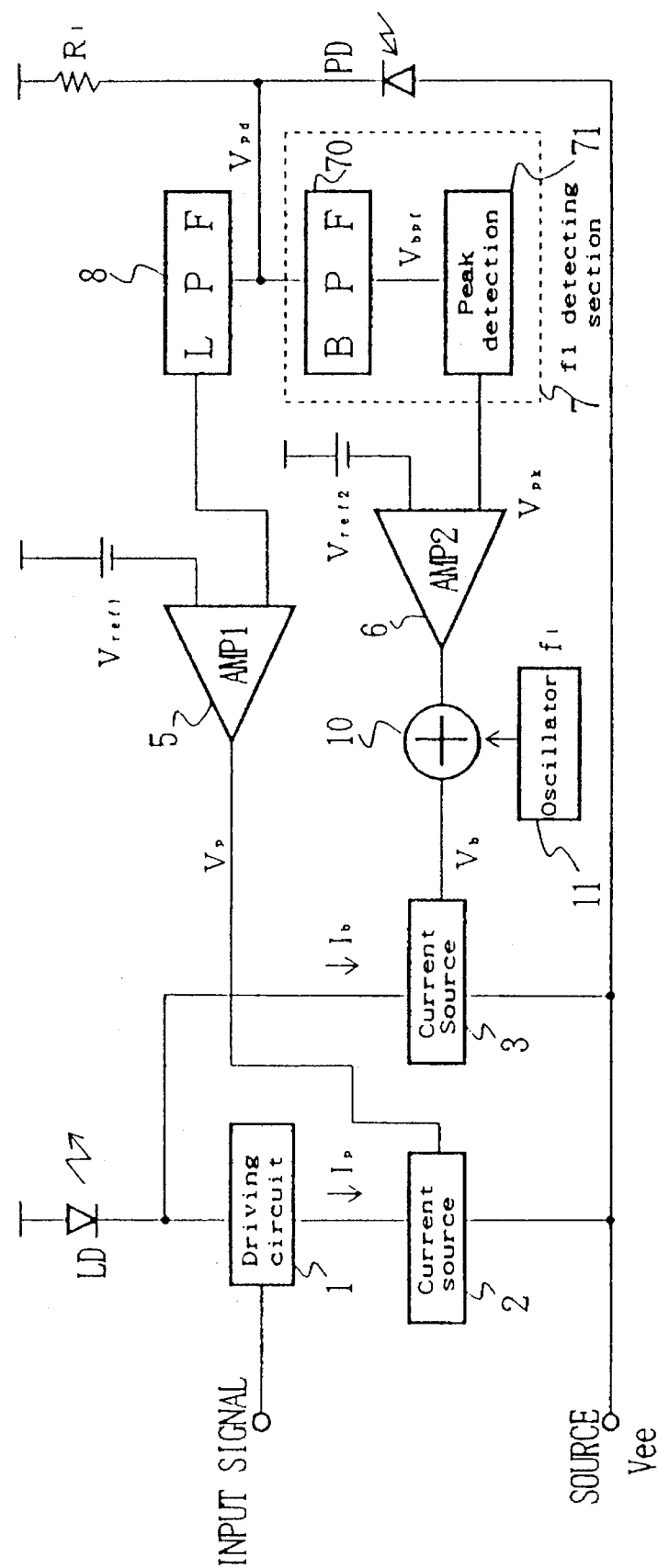
FIG. 6 is a block diagram of the second embodiment according to the present invention.
Figure 7:
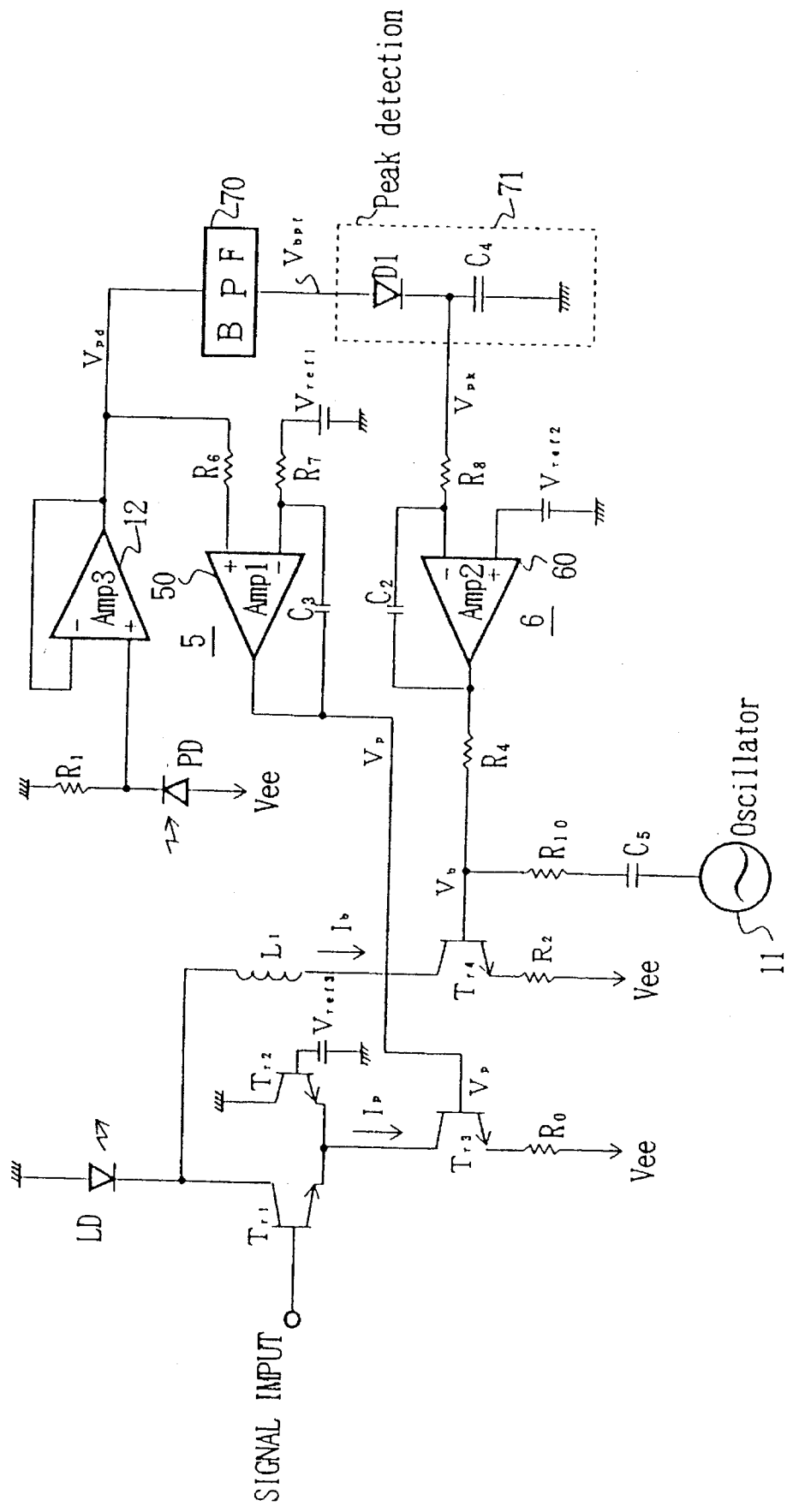
FIG. 7 is a detailed diagram showing the circuit of the second embodiment according to the present invention.

FIG. 6 is a block diagram of the second embodiment according to the present invention. FIG. 7 is a detailed diagram showing the circuit corresponding to the embodiment shown in FIG. 6.

Hereupon, the difference between the above-described first embodiment shown in FIGS. 1 and 2 and the second embodiment will be considered. In the first embodiment, the output of the amplifier 5 is modulated by the signal which is obtained by reversing the f1 frequency signal from the oscillator 11 in phase. Accordingly, the peak of the light output is of the fixed level, as shown in FIGS. 3A through 3C, 4A through 4C, and 5A through 5C.

On the contrary, in the second embodiment, the output of the amplifier 5 is used as the driving control voltage Vp for the LD, as it is, to simplify the structure. Thus, same numerals or symbols as FIG. 1 are used in FIGS. 6 and 7.

To simplify the structure of the second embodiment, the structure for modulating the output of the amplifier 5 by reversing the phase of the output of the oscillator 11, that is, an operational amplifier 13, resistors R3, R9, R11, and R12 and a capacitor C1 are omitted in FIG. 7.

The function and operation of the second embodiment are same basically as those of the first embodiment, except the part as will be explained below. The operation of the second embodiment will be now explained with reference to FIGS. 8A through 8C, 9A through 9C, and 10A through 10C.

Figure 8A:
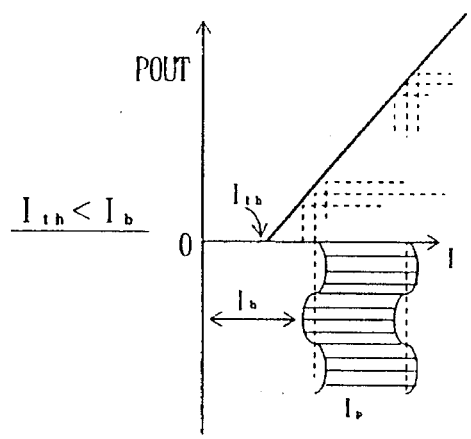
FIG. 8A through 8C are first explanatory diagrams of the operation of the second embodiment according to the present invention.
Figure 8B:
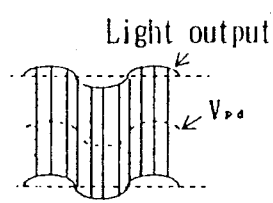
Figure 8C:
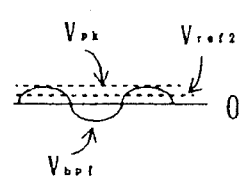

FIGS. 8A through 8C are explanatory diagrams of the operation in the case where the relation between the threshold current Ith and the bias current Ib is Ith<Ib. As explained in FIGS. 1 and 2, the bias current voltage Vb is the signal of frequency f1 from the oscillator 11 added (modulated) to the output of the amplifier 6, and supplied to the base of the transistor Tr4.

Consequently, the collector current of the transistor Tr4, that is, the bias current Ib changes in correspondence with the signal of frequency f1. Further, as shown in FIG. 8A, the current Ip flowing due to switching the transistor Tr3 ON or OFF, according to the input signal '1' or '0' is piled up with the bias current Ib.

Here, in the case of the second embodiment, the output of the amplifier 5 is used as the driving current voltage Vp, as it is. Accordingly, the signal component of frequency f1 from the oscillator 11 is piled up in the right-receipt signal of the PD. Therefore, as it is apparent from the comparison with FIG. 3A, the end portion of the driving current Ip of the LD is not flat, and is changed in correspondence with the signal component of f1, as shown in FIG. 8A.

FIG. 8B shows the light output which is emitted corresponding to the current flowing to the LD shown in FIG. 8A. In FIG. 8B, the Vpd is an average value of the light output Pout detected by the PD, as explained above.

FIG. 8C is a diagram showing the relation between the voltage Vbpf obtained by passing the Vpd through the band pass filter 70 and the peak voltage Vpk detected by the peak detecting circuit 71 of voltage Vbpf. In the example shown in FIGS. 8A through 8C, the f1 frequency component of the oscillator 11 appears in the voltage Vpd, as it is. Accordingly, the relation between the peak voltage Vpk and the second reference voltage Vref2 becomes Vpk>Vref2.

In this case, the control voltage Vp is reduced, so that the collector current of the transistor Tr4, that is, the bias current Ib is controlled to be reduced.

Figure 9A:
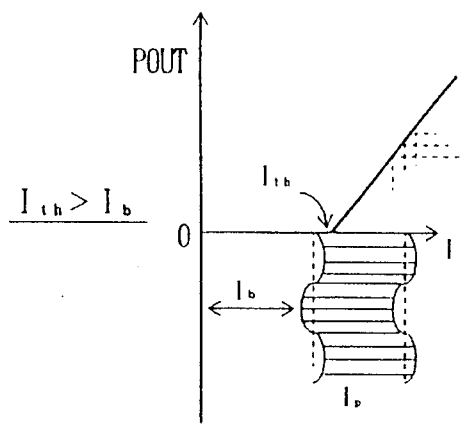
FIG. 9A through 9C are second explanatory diagrams of the operation of the second embodiment according to the present invention.
Figure 9B:
Figure 9C:
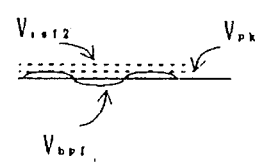

FIGS. 9A through 9C are explanatory diagrams of the operation in the case where the relation between the threshold current Ith and the bias current Ib is Ith>Ib, opposite FIGS. 8A through 8C. FIG. 9A shows the situation where the bias current Ib is smaller than the threshold current Ith.

FIG. 9B shows a light output which is emitted, in correspondence with the current flowing to the LD shown in FIG. 9A. In FIG. 9B, the Vpd is an average value of the light output Pout detected by the PD, as described above.

In the example shown in FIG. 9B, the f1 frequency component of the oscillator 11 does not appear in the Vpd in the lower section of the light output. Similarly the case shown in FIG. 4B. However, in the upper section, as described above, the piled f1 frequency component remains in the control voltage Vp, so that the f1 frequency component appears in the average value Vpd of the light output.

Accordingly, the f1 frequency component appears on the voltage Vbpf obtained by passing the Vpd via the band pass filter 70, as shown in FIG. 9C.

However, as described above, the f1 frequency component of the oscillator 11 does not appear in the Vpd in the lower section of the light output, as well as in the case shown in FIG. 4B, so that the level of the f1 frequency component of the voltage Vbpf is reduced by half.

At the same time, the peak voltage Vpk of the f1 frequency component of the voltage Vbpf, detected in the peak detecting circuit 71 is smaller than the second reference voltage Vbpf2. FIG. 9C shows this situation.

In the example shown in FIGS. 9A through 9C, the relation between the peak voltage Vpk and the second reference voltage Vref2 becomes Vpk<Vref2, so that the control voltage Vb is increased, thus the collector current of the transistor Tr4, that is, the bias current Ib is controlled so as to increase.

Figure 10A:
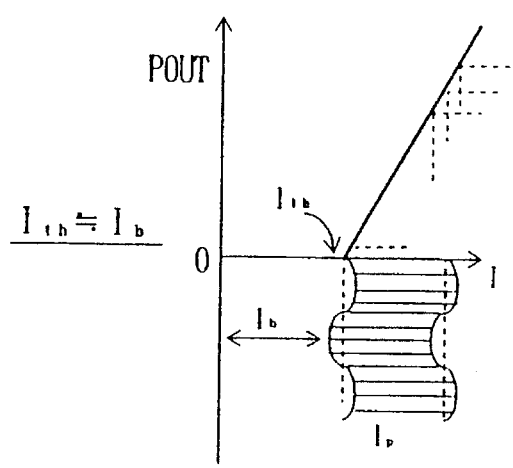
FIG. 10A through 10C are third explanatory diagrams of the operation of the second embodiment according to the present invention.
Figure 10B:
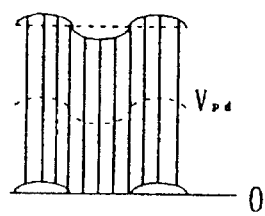
Figure 10C:
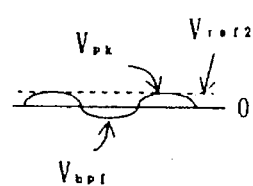

FIGS. 10A through 10C are explanatory diagrams of the operation, in the case where the bias current Ib is controlled so as to be reduced, when Ith<Ib, as shown in FIGS. 8A through 8C, and the bias current Ib is controlled so as to increase, when Ith>Ib, as shown in FIGS. 9A through 9C, in opposite to FIGS. 8A through 8C, so that the relation becomes Ith≈Ib, as the result.

The f1 frequency component does not remain piled at both the driving current voltage Vp and the driving current Ip, as shown in FIG. 10A, so that the f1 frequency component appears in the upper section of the light output, as it is.

On the other hand, the threshold current Ith corresponds to the bias current Ib of direct current, as shown in FIG. 10A. However, the f1 frequency component of the oscillator 11 is piled up on the bias current Ib, so that the bias current Ib becomes over the threshold current Ith, within the period of one half-circle of the f1 frequency component, and the bias current Ib becomes the threshold current Ith or below within the period of another half-circle.

Thus, when the bias current Ib becomes the threshold current Ith or below, the current becomes 0 within the period of one half-circle of the f1 frequency component in the lower section of the light output, as shown in FIG. 10B.

Accordingly, the part which becomes 0 within the period of one half-circle on the average value Vpd of the light output, so that the peak voltage Vpk of the voltage Vbpf obtained via the band pass filter 70 becomes equal to the voltage Vbpf, as shown in FIG. 10C.

That is, Ith=Ib can be always kept, if the second reference voltage is controlled so as to be Vpk=Vbpf2, when Ith=Ib, as well as the first embodiment with a simpler structure, in the second embodiment.

Figure 11:
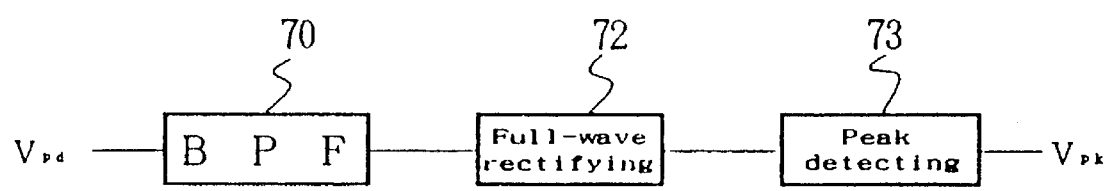
FIG. 11 is a first modified example of the method for detecting the f1 frequency component.
Figure 12:
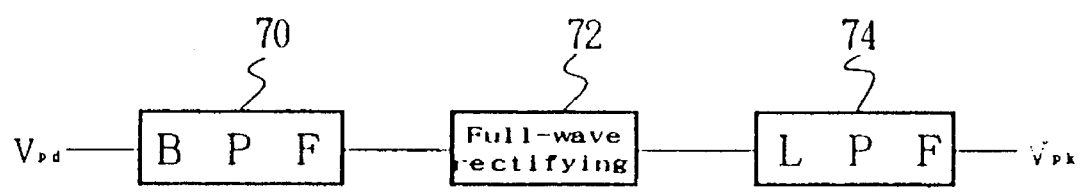
FIG. 12 is a second modified example of the method for detecting the F1 frequency component.
Figure 13:
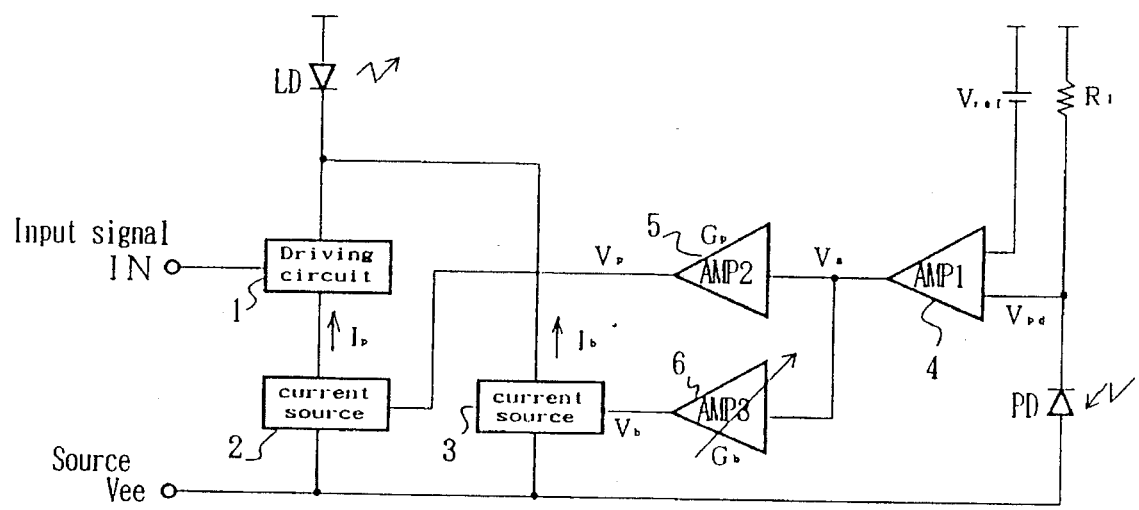
FIG. 13 is a block diagram of the prior art.
Figure 14:
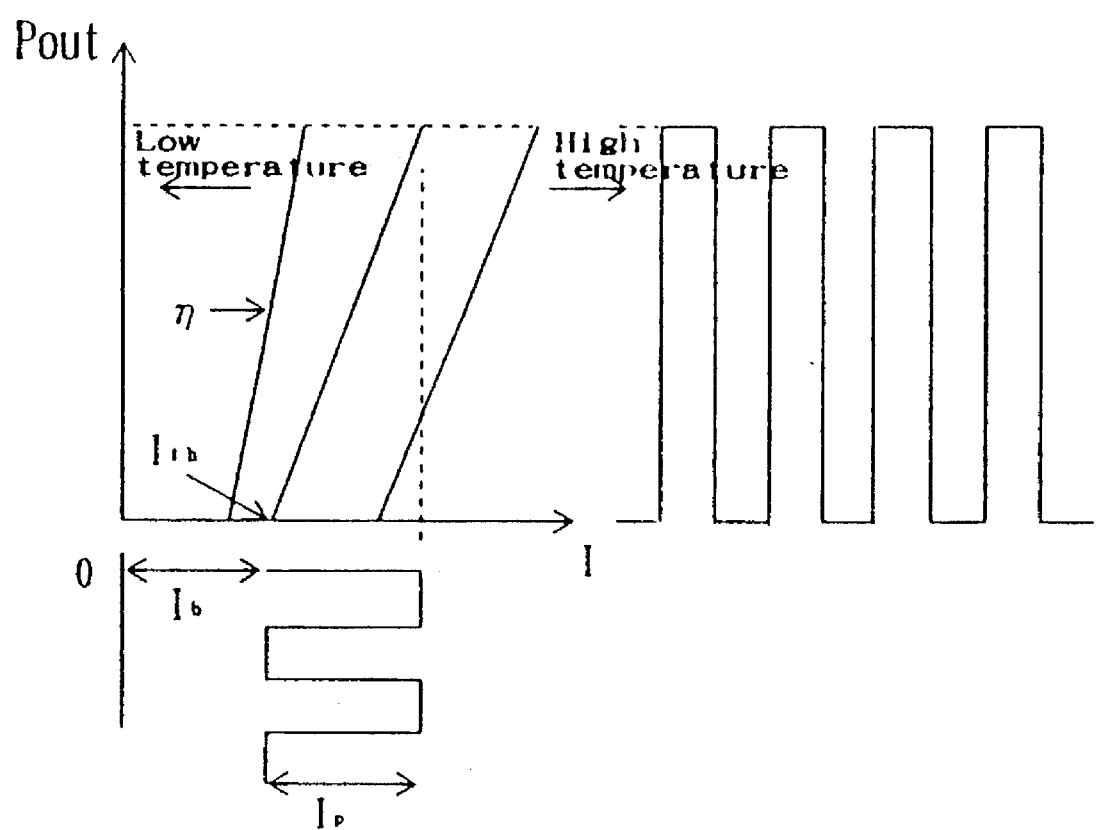
FIG. 14 is a diagram explaining problems in the prior art.

FIGS. 11 and 12 are modified examples of the f1 component detecting section 7 shown in FIGS. 2 and 7. The f1 component detecting section 7 shown in FIGS. 2 and 7 is composed of the band pass filter 70 and the peak detection circuit composed of diode D1, and capacitor C1.

On the contrary, the structure shown in FIG. 11 has a band pass filter 70, a full-wave rectifying circuit 72 and a peak detection circuit 73. The structure shown in FIG. 12 includes a smoothing circuit 74 which is composed of a low pass filter instead of the peak detection circuit 73 of the structure shown in FIG. 11.

It is possible to obtain the accurate peak value voltage Vpk which is averaged (direct current), according to the modified examples shown in FIGS. 11 and 12.

As explained above according to the embodiments, it is possible to adjust or control the driving current voltage Vp and the bias current voltage Vb of the LD, independently, according to the present invention. Further, the bias current voltage Vb is controlled by the signal of the f1 frequency which is lower than that of the input signal, so that the light emitted output of the LD is detected by the PD, the level of the signal of the f1 frequency included therein is detected, and the level is feedbacked so as to be a fixed value.

Accordingly, the ratio between the driving current Ip the size of which is decided according to the driving control voltage Vp and the bias current the size of which is determined according to the bias control voltage Vb which can be controlled easily. Consequently, the relation of the light output, the threshold current Ith and the bias current Ib can be kept constant.

What is claimed is:

1. An optical signal transmitter having an Auto Power Control (APC) circuit with automatic bias current control, comprising:

a laser diode supplied with a bias current signal and an input signal, for outputting a light output according to a level of the input signal;

a photo diode for detecting the light output emitted from the laser diode;

an oscillator for generating and outputting a low frequency signal having a frequency which is lower than that of the input signal;

a circuit for modulating a bias current signal in amplitude with said low frequency signal received from said oscillator; and a circuit, coupled to said photo diode, for detecting a signal component having said frequency which is lower than that of the input signal and is included in the light output of said laser diode for controlling the bias current so that the detected signal component becomes of a fixed value, said circuit for detecting said signal component including:

a detecting circuit for detecting said signal component of said frequency, included in the light output of the laser diode;

an amplifier for outputting a difference signal between an output of the detecting circuit and a fixed reference voltage;

an adder circuit, coupled to said amplifier and to said oscillator, for adding an output of said amplifier to the low frequency signal output from said oscillator; and a current source, coupled to said adder circuit, for controlling a value of the bias current in correspondence to the output of the adder circuit.

2. The optical signal transmitter according to claim 1, wherein the current source has a transistor connected to the laser diode in series, and the output of the adder circuit is connected to a base of the transistor.

3. The optical signal transmitter according to claim 1, wherein said detecting circuit for detecting said signal component included in the light output of the laser diode has a band pass filter for passing and outputting a signal of the frequency which is lower than that of the input signal, and a peak detecting circuit, coupled to said band pass filter, for outputting a peak value of the output of the band pass filter.

4. The optical signal transmitter according to claim 3, wherein said peak detecting circuit includes a series circuit of a diode and a capacitor.

5. The optical signal transmitter according to claim 1, wherein the detecting circuit for detecting said signal component included in the light output of the laser diode has a band pass filter for passing and outputting a signal of said frequency which is lower than that of the input signal; a full-wave rectifying circuit for full-wave rectifying the output of the band pass filter and outputting a full-wave rectified output; and a circuit for detecting a peak value of the output of the full-wave rectifying circuit and outputting the peak value of the full-wave rectified output.

6. The optical signal transmitter according to claim 1, wherein said detecting circuit for detecting said signal component included in the light output of the laser diode has a band pass filter for passing and outputting a signal of the frequency lower than that of the input signal; a full-wave rectifying circuit for full-wave rectifying the output of the band pass filter and outputting a full-wave rectified signal; and a low pass filter for smoothing said full-wave rectified signal output from the full-wave rectifying circuit.

7. The optical signal transmitter according to claim 1, and further comprising a circuit for controlling a driving current of the laser diode so as that an output of the photo diode, which detects the light emitted from the laser diode is a fixed value.

8. The optical signal transmitter according to claim 7, wherein the circuit for controlling a driving circuit has an amplifier for outputting a difference between the output of the photo diode, which detects the light emitted from the laser diode and a fixed reference voltage, and a current source of a driving current supplied to the laser diode, which controls the value of the driving current, according to the output of the amplifier.

9. The optical signal transmitter according to claim 8, and further comprising a subtracting circuit for outputting a difference between the output of the amplifier and the signal output from the oscillator.

10. The optical signal transmitter according to claim 9, wherein said subtracting circuit reverses the signal output from the oscillator in phase and adds a phase-reversed signal component to the output of the amplifier.

* * * * *